(12) United States Patent
Kartashyan et al.

(10) Patent No.: US 10,770,267 B1
(45) Date of Patent: Sep. 8, 2020

(54) METHODS AND APPARATUS FOR SUPPLYING RF POWER TO PLASMA CHAMBERS

(71) Applicant: APPLIED MATERIALS, INC., Santa Clara, CA (US)

(72) Inventors: Smbat Kartashyan, Santa Clara, CA (US); David Totedo, Austin, TX (US); Kartik Ramaswamy, San Jose, CA (US); Jay Merkel, Los Gatos, CA (US); Omid Amirkiai, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/526,143

(22) Filed: Jul. 30, 2019

(51) Int. Cl.
*H05B 33/00* (2006.01)
*H01J 37/32* (2006.01)
*H03H 7/01* (2006.01)
*H03H 7/38* (2006.01)

(52) U.S. Cl.
CPC ..... *H01J 37/32183* (2013.01); *H03H 7/0115* (2013.01); *H03H 7/38* (2013.01); *H01J 2237/334* (2013.01)

(58) Field of Classification Search
CPC .......... H04B 10/2575; H04B 10/25752; H04B 10/40; H04B 10/5561; H04B 10/697; H05B 1/0233; H05B 6/686; H05B 6/705; H05B 6/802
See application file for complete search history.

(56) References Cited

U.S. PATENT DOCUMENTS

| 7,994,872 B2 | 8/2011 | Shannon et al. |
| 9,673,069 B2 | 6/2017 | Trachuk et al. |
| 2009/0232191 A1* | 9/2009 | Gupta ................. H04L 27/2096 375/216 |

OTHER PUBLICATIONS

Armenian Journal of Physics, 2015, vol. 8, issue 1, pp. 44-50, On the Method of Monitoring and Optimal Control of RF-Plasma, A. Aghajanyan, A. Hakhoumian, N. Poghosyan, T. Poghosyan, and T. Zakaryan*, Institute of Radiophysics and Electronics, Armenian National Ac. Sci. Alikhanian brs. 1, Ashtarak, 0203, Armenia, *e-mail: tigr@irphe.am.
(Continued)

*Primary Examiner* — Monica C King
(74) *Attorney, Agent, or Firm* — Moser Taboada; Alan Taboada

(57) ABSTRACT

Methods and apparatus for matching an impedance of a process chamber with an impedance of an RF power source. In some embodiments, a method comprises dynamically matching a load impedance of the process chamber with an impedance matching circuit coupled between an RF power source and the process chamber, the impedance matching circuit configured to compensate for changes in the load impedance to match an impedance of the RF power source over a wide range of load impedances; filtering power feeding back from the process chamber with a first filter positioned between the matching circuit and the process chamber, the first filter configured as a wide bandpass filter; and filtering residual signals with a second filter positioned between the matching circuit and the RF power source, the second filter configured as a low pass filter.

20 Claims, 5 Drawing Sheets

(56) References Cited

OTHER PUBLICATIONS

Navio Digital Matching Network, Quick, Accurate, and Repeatable Digital Impedance Matching, advanced-energy.com, p. 1-7, ©2018 Advanced Energy Industries, Inc. All rights, reserved. Advanced Energy®, Cesar®, and Navio™ are U.S. trademarks of, Advanced Energy Industries.
Adaptive Impedance Matching Circuits Based onFerroelectric and Semiconductor Varactors, by, Jia-Shiang Fu A dissertation submitted in partial ful llment of the requirements for the degree of Doctor of Philosophy,(Electrical Engineenng),in The University of Michigan, 2009.
Impedance Matching Controller for an Inductively Coupled Plasma Chamber L-type Matching Network Automatic Controller Giorgio Bacelli, John V. Ringwood and Petar Iordanov Department of Electronic Engineering, National University of Ireland, Maynooth, Ireland gbacelli@eeng.nuim.ie, john.ringwood@eeng.nuim.ie, Petar. Iordanov@eeng.nuim.ie.

* cited by examiner

METHODS AND APPARATUS FOR SUPPLYING RF POWER TO PLASMA CHAMBERS

FIELD

Embodiments of the present principles generally relate to semiconductor processing.

BACKGROUND

In conventional radio frequency (RF) plasma processing, such as that used during stages of fabrication of many semiconductor devices, RF energy may be provided to a substrate process chamber via an RF energy source. The RF energy may be generated and provided in continuous or pulsed wave modes. Due to mismatches between the impedance of the RF energy source and the plasma formed in the process chamber, RF energy is reflected back to the RF energy source, resulting in inefficient use of the RF energy and wasting energy, potential damage to the process chamber or RF energy source, and potential inconsistency/non-repeatability issues with respect to substrate processing. As such, the RF energy is often coupled to the plasma in the process chamber through a fixed matching network that operates to minimize the reflected RF energy by matching the impedance of the plasma to the impedance of the RF energy source. The matching network ensures that the output of the RF source is efficiently coupled to the plasma to maximize the amount of energy coupled to the plasma (e.g., referred to as tuning the RF power delivery) by minimizing impedance mismatch. However, the plasma impedance is not constant and induces variances in impedances that the matching network may not be able to compensate for, reducing the efficiency of the RF energy source.

Accordingly, the inventors have provided improved methods and apparatus for matching impedances between the plasma and RF energy source.

SUMMARY

Methods and apparatus for matching impedances between an RF power source and a plasma chamber are provided herein.

In some embodiments, a method for matching an impedance of a process chamber may comprise dynamically matching a load impedance of the process chamber with an impedance matching circuit coupled between a radio frequency (RF) power source and the process chamber, the impedance matching circuit configured to compensate for changes in the load impedance to match an impedance of the RF power source over a wide range of load impedances, filtering power feeding back from the process chamber with a first filter positioned between the matching circuit and the process chamber, the first filter configured as a wide bandpass filter, and filtering residual signals with a second filter positioned between the matching circuit and the RF power source, the second filter configured as a low pass filter.

In some embodiments, the method may further include wherein the first filter is a second order filter, wherein the second filter is at least a first order filter, wherein the second filter is at least a third order filter, configuring parameters of the first filter to have a time constant such that the first filter operates at a frequency at least two times higher than a working frequency of the RF power source, configuring the first filter and the second filter to provide a combined fifth order filter, wherein the combined fifth order filter has an attenuation of approximately 60 dB per decade to approximately 100 dB per decade of filtered frequencies, and/or configuring the first filter to provide filtration of frequencies above a cutoff frequency.

In some embodiments, an apparatus for matching an impedance of a process chamber may comprise an impedance matching circuit configured to compensate for an impedance loading of the process chamber to allow the impedance loading to match an impedance of a radio frequency (RF) power source connected to the process chamber, a first filter coupled between the impedance matching circuit and the process chamber, the first filter configured as a wide bandpass filter and configured to protect the RF power source from reverse power from the process chamber, and a second filter coupled between the impedance matching circuit and the RF power source, the second filter configured as a low pass filter to reduce residual signals from reaching the RF power source.

In some embodiments, the apparatus may further include wherein the first filter is a second order filter, wherein the second filter is at least a first order filter, wherein the second filter is at least a third order filter, wherein the first filter is configured to have a time constant such that the first filter operates at a frequency at least two times higher than a working frequency of the RF power source, wherein the first filter and the second filter are configured to provide a combined fifth order filter with an attenuation of approximately 60 dB per decade to approximately 100 dB per decade of filtered frequencies, and/or wherein the first filter is configured to provide filtration of frequencies above a cutoff frequency.

In some embodiments, an apparatus for providing power to a process chamber may comprise a radio frequency (RF) power source configured to generate RF source energy to form a plasma in the process chamber and an impedance matching network configured with an impedance matching circuit configured to compensate for an impedance loading of the process chamber to allow the impedance loading to match an impedance of the RF power source connected to the process chamber, a first filter coupled between the impedance matching circuit and the process chamber, the first filter configured as a wide bandpass filter and configured to protect the RF power source from reverse power from the process chamber, and a second filter coupled between the impedance matching circuit and the RF power source, the second filter configured as a low pass filter to reduce residual signals from reaching the RF power source.

In some embodiments, the apparatus may further include wherein the first filter is a second order filter, wherein the second filter is at least a first order filter, wherein the second filter is at least a third order filter, and/or wherein the first filter is configured to have a time constant such that the first filter operates at a frequency at least two times higher than a working frequency of the RF power source.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
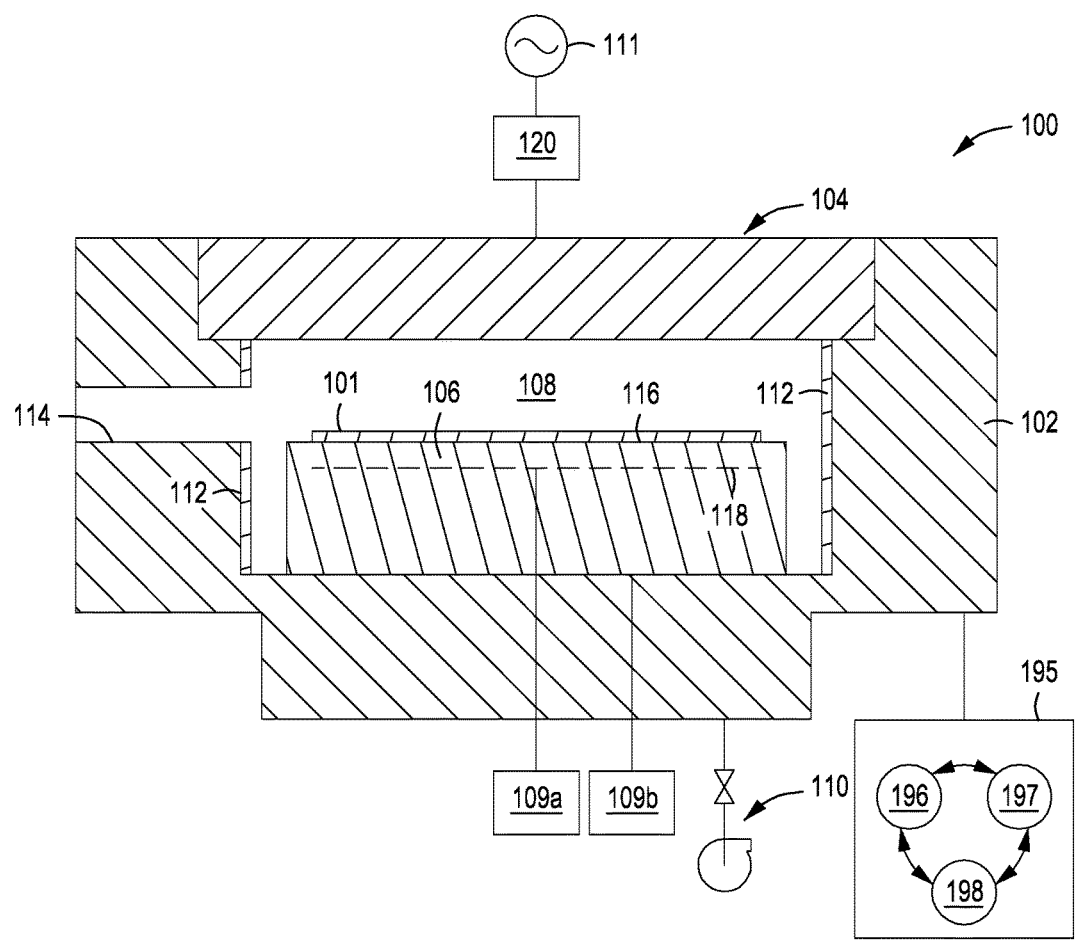
FIG. 1 is a cross-sectional view of a process chamber in accordance to some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide improved impedance matching between a radio frequency (RF) power source and plasma induced in a process chamber. An impedance matching network of the present principles has a wide tuning range (impedance Z coverage area) with an optimal method of filtration of RF multi-frequency reverse signals that exist in plasma formed by multiple generators. The wide Z matching network of the present principles is a safe, stable, and cost effective solution over fixed frequency designed matching networks. In some embodiments, the wide Z matching network includes a wide bandpass $2^{nd}$ order filter that is coupled to an output of a matching circuit to attenuate effects of reverse RF power from plasma without changing the impedance coverage area, while a low pass $3^{rd}$ order filter is coupled to an input of the matching circuit to provide additional attenuation of residual reverse signal from plasma. The wide Z matching network uses less parts (more cost effective), is easy to assemble and tune (small changes in some part parameters such as inductance values, capacitance values does not affect match parameters) for different power levels and impedance ranges. Because the wide Z matching network uses fewer parts, reliability is also increased over traditional matching networks. Stability of the wide Z coverage also provides consistency of characteristics of the matching network.

A significant advantage of the matching network of the present principles is the wide and stable impedance coverage. The advantage allows the wide Z matching network to work with plasma chambers with additional frequencies induced in the plasma from frequency generators other than the RF power source coupled to the input of the wide Z matching network. The inventors have found that using narrow band rejecter filters for each frequency existing in the plasma is not optimal nor cost effective. If, for example, a chamber is powered by three different generators, each generator used in a plasma chamber would require two different dual frequency narrow band filters (total of 4 filters each), dramatically decreasing reliability of the process chamber and substantially increasing assembly and tuning time along with costs. If isolation between generators is lost due to filter parameter changes, the risk of arcing occurring in a matching network increases and affects other system parameters causing stability and repeatability to diminish in chamber processes.

The inventors found that, due to the variable impedance on an output of a matching network, using a high order narrow bandpass filter without negatively affecting matching capability and impedance coverage cannot be done. The inventors discovered that using a first filter such as a $2^{nd}$ order wide bandpass LC filter on the output of the matching circuit provided isolation from the plasma and covers the matching impedance without changing parameters. In some embodiments, the $2^{nd}$ order filter attenuates frequencies other than the matching frequency by 10 to 15 times, reducing or preventing arcing risks in the matching network. A second filter is used on the input of the matching circuit to filter residual reverse signals from plasma without affecting the wide impedance coverage. In some embodiments, the second filter is at least a $3^{rd}$ order low pass filter. The use of the terms matching circuit and impedance matching herein shall mean that the real part of the impedance should be approximately equal to the real part of the load and reactances should be approximately equal and opposite in character.

When increasing the impedance coverage area of traditional matching networks, the inventors have found that that the rejection filters made increasing the coverage difficult because in attempting to have wide impedance coverage the rejection filters are affected, limiting the impedance coverage area. The output of the matching network may have a variable impedance (approximately 50 ohms to approximately 1 k ohms) which is, at the same time, the input of the filter. Variability of the filter input impedance strongly affects the attenuation parameters and the pass band wideness which makes a narrow band filter unfunctional. Another issue with rejection filters is the tuning time during the assembly of the matching network.

The inventors have discovered that when using a design with wide impedance coverage area, attention should be given to the time constant of the filters—the cut off frequency should be very high compared to the working frequency. The inventors have found that the input side of the matching circuit may be narrow band, but the output side of the matching circuit should be wide band. Traditional matching networks use shunting capacitors for protection of the matching network from reverse power coming from the load. The cable between the matching network and the process chamber will then have a high current which is a burning risk and produces high emissions of electromagnetic radiation. The electromagnetic radiation causes detrimental effects to other parts of the process chamber, the matching network, as well as the environment. The inventors have discovered that the suggested filtration methods of the present principles eliminate the negative impacts of the traditional matching networks.

FIG. 1 is a cross-sectional view of a process chamber 100 in which embodiments of the present principles may be implemented. As shown, the process chamber 100 is an etch chamber suitable for etching a substrate, such as substrate 101. Examples of process chambers which benefit from aspects described herein are available from Applied Materials, Inc., located in Santa Clara, Calif. Other process chambers, including non-etching chambers and chambers from other manufacturers, may be adapted to benefit from aspects of the present principles. In some embodiments, the process chamber 100 includes a chamber body 102, a gas distribution plate assembly 104, and a substrate support 106. The chamber body 102 of the process chamber 100 includes or may be formed from one or more process-compatible materials, such as aluminum, anodized aluminum, nickel plated aluminum, nickel plated aluminum 6061-T6, stainless steel, as well as combinations and alloys thereof, for example.

The substrate support 106 functions as an electrode in conjunction with the gas distribution plate assembly 104. As such, a plasma may be formed in a processing volume 108 defined between the gas distribution plate assembly 104 and an upper surface of the substrate support 106. The substrate support 106 includes or is formed of a conductive material, such as aluminum, a ceramic material, or a combination of both. The chamber body 102 is also coupled to a vacuum system 110 that includes a pump and a valve, and a liner 112 may be disposed on surfaces of the chamber body 102 in the processing volume 108. The chamber body 102 includes a port 114 formed in a sidewall thereof. The port 114 is selectively opened and closed to allow access to the interior of the chamber body 102 by a substrate handling robot (not shown). In such an embodiment, a substrate 101 is transferred in and out of the process chamber 100 through the port 114. The substrate 101 is positioned on the upper surface 116 of the substrate support 106 for processing. Lift pins (not shown) may be used to space the substrate 101 away from the upper surface of the substrate support 106, such as to enable exchange with the substrate handling robot during substrate transfer. The gas distribution plate assembly 104 is positioned on the chamber body 102.

A power source 111, such as an RF power source, is coupled to the gas distribution plate assembly 104 via a matching network 120 to electrically bias the gas distribution plate assembly 104 relative to the substrate support 106 to facilitate plasma generation within the process chamber 100. The power source 111 may operate over a wide range of frequencies dependent on a given process. The matching network 120 corrects the impedance of the process chamber 100 to that of the RF power source to maximize power transfer from the RF power source (power source 111) to the process chamber 100. In some embodiments, the matching network 120 encompasses aspects of the present principles as disclosed herein to provide an optimal matching network with wide impedance coverage and superior isolation. In some embodiments, the matching network 120 may transform the complex impedance of the process chamber into a 50 ohm load preferred by an RF power source. In some embodiments, the power source 111 may include an RF power source that operates from approximately 13.56 MHz to approximately 160 MHz.

The substrate support 106 includes an electrostatic chuck 118, in which the electrostatic chuck 118 may be connected to a power source 109a to facilitate chucking of the substrate 101 and/or to influence a plasma located within the processing volume 108. The power source 109a includes a power supply, such as a DC or RF power source, and is connected to one or more electrodes of the electrostatic chuck 118. A bias source 109b may additionally or alternatively be coupled with the substrate support 106 to assist with plasma generation and/or control, such as to an edge ring assembly.

The bias source 109b may illustratively be a source of up to about 1000 W (but not limited to about 1000 W) of RF energy at a frequency of, for example, approximately 13.56 MHz, although other frequencies and powers may be provided as desired for particular applications. The bias source 109b is capable of producing either or both of continuous or pulsed power. In some aspects, the bias source may be capable of providing multiple frequencies, such as 13.56 MHz and 2 MHz.

The process chamber 100 may also include a controller 195. The controller 195 includes a programmable central processing unit (CPU) 196 that is operable with a memory 197 and a mass storage device, an input control unit, and a display unit (not shown), such as power supplies, clocks, cache, input/output (I/O) circuits, and the liner, coupled to the various components of the processing system to facilitate control of the substrate processing. To facilitate control of the process chamber 100 described above, the CPU 196 may be one of any form of general purpose computer processor that can be used in an industrial setting, such as a programmable logic controller (PLC), for controlling various chambers and sub-processors. The memory 197 is coupled to the CPU 196 and the memory 197 is non-transitory and may be one or more of random access memory (RAM), read only memory (ROM), floppy disk drive, hard disk, or any other form of digital storage, local or remote. Support circuits 198 are coupled to the CPU 196 for supporting the processor. Applications or programs for charged species generation, heating, and other processes are generally stored in the memory 197, typically as software routine. The software routine may also be stored and/or executed by a second CPU (not shown) that is remotely located from the process chamber 100 being controlled by the CPU 196.

The memory 197 is in the form of computer-readable storage media that contains instructions, when executed by the CPU 196, to facilitate the operation of the process chamber 100. The instructions in the memory 197 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
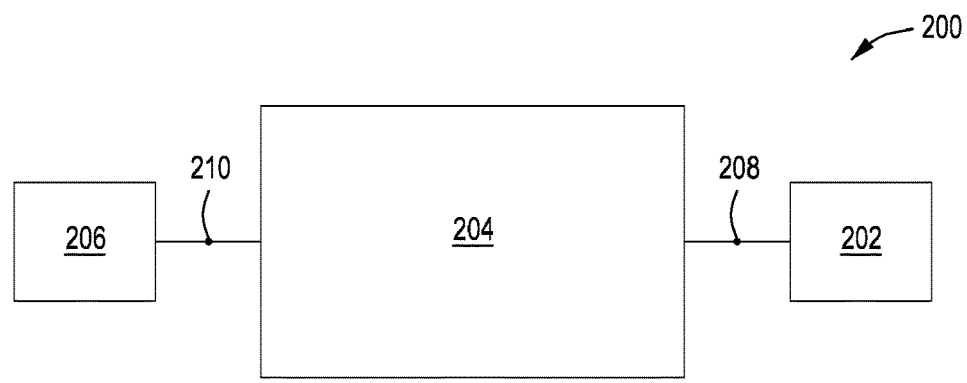
FIG. 2 is a block diagram of a matching network in accordance with some embodiments of the present principles.
Figure 8:
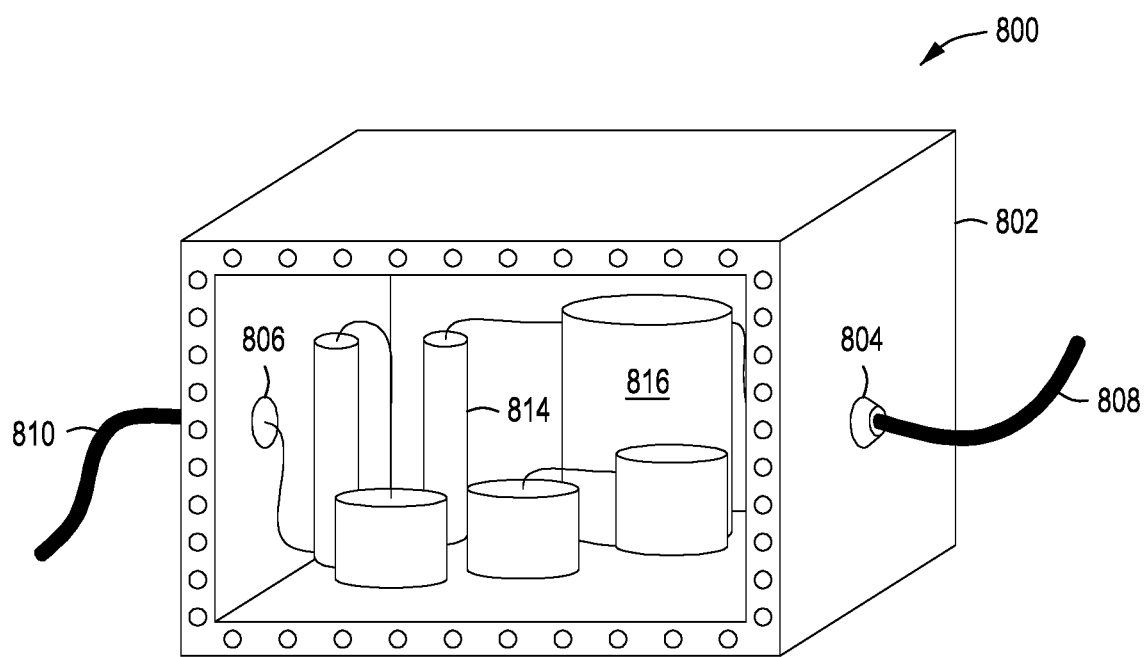
FIG. 8 is an isometric view of a matching network in accordance with some embodiments of the present principles.

FIG. 2 is a block diagram 200 of a matching network 204 in accordance with some embodiments. The matching network 204 has an input 208 coupled to an RF power source 202 such as power source 111 of FIG. 1 and an output 210 coupled to a plasma chamber 206 such as the process chamber 100 of FIG. 1. In some embodiments, the matching network 204 may be a single field replaceable unit (FRU) 800 as illustrated in FIG. 8 (shown with a side panel removed). The RF power source 202 may be coupled to an input 804 of the FRU via an input cable 808 and coupled to the plasma chamber 206 at an output 806 via a cable 810. In some embodiments, the FRU 800 may include a case 802 and at least one inductor 816 and at least one capacitor 814 to comprise the matching network 204.

Figure 3:
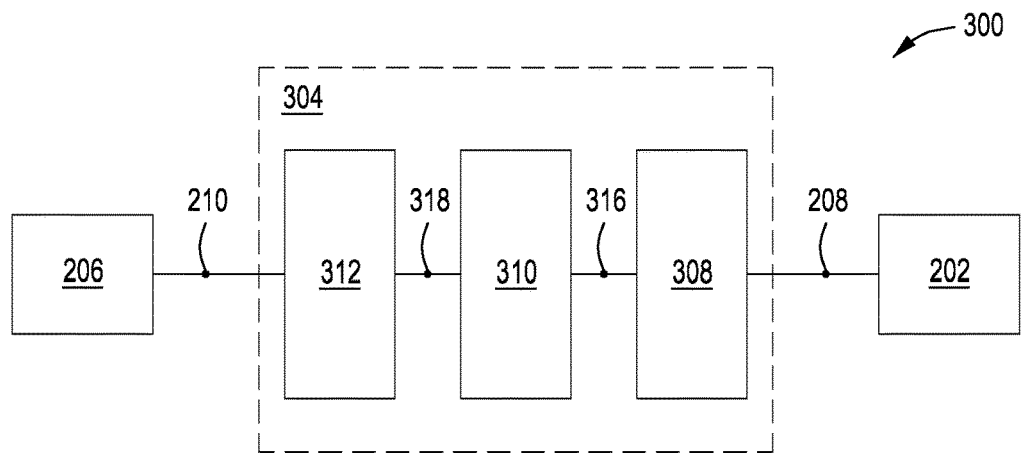
FIG. 3 is a block diagram of components of a matching network in accordance with some embodiments of the present principles.

FIG. 3 is a block diagram 300 of components of a matching network 304 in accordance with some embodiments. The matching network 304 includes a matching circuit 310, a first filter 312, and a second filter 308. In some embodiments, the first filter 312 is a wide bandpass filter that provides isolation from the plasma chamber 206 coupled to the output 210 of the matching network 304 and covers the matching impedance without changing parameters. The first filter 312 is coupled to the output 318 of the matching circuit 310 and the output 210 of the matching network 304. In some embodiments, the first filter 312 attenuates frequencies other than the matching frequency by 10 to 15 times, reducing or preventing arcing risks in the matching network. A second filter 308 is coupled between the input 316 of the matching circuit 310 and the input 208 of the matching network 304 coupled to the RF power source 202 to further filter residual reverse signals from plasma without affecting the wide impedance coverage of the matching network 304.

Figure 4:
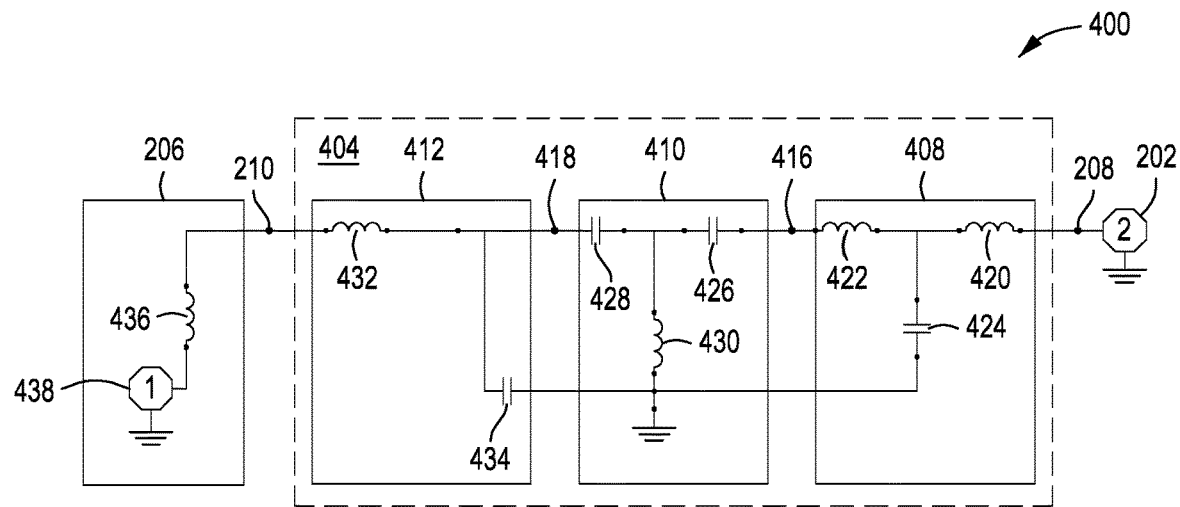
FIG. 4 is a schematic of a matching network in accordance with some embodiments of the present principles.

FIG. 4 is a schematic 400 of a matching network 404 in accordance with some embodiments. The matching network 404 includes a matching circuit 410, a first filter 412, and a second filter 408. In some embodiments, the first filter 412 is a $2^{nd}$ order wide bandpass LC filter (conductor 432, capacitor 434) that provides isolation from the plasma chamber 206 (represented by power load 438 and inductive load 436) coupled to the output 210 of the matching network 404 and covers the matching impedance without changing parameters. The first filter 412 is coupled to the output 418 of the matching circuit 410 and the output 210 of the matching network 404. In some embodiments, the first filter 412 attenuates frequencies other than the matching frequency by 10 to 15 times, reducing or preventing arcing risks in the matching network. A second filter 408 is coupled between the input 416 of the matching circuit 410 and the input 208 of the matching network 404 coupled to the RF power source 202 to further filter residual reverse signals from plasma without affecting the wide impedance coverage of the matching network 404. In some embodiments, the second filter 408 is at least a $1^{st}$ order low pass filter. In some embodiments, the second filter 408 is at least a $3^{rd}$ order low pass filter. In some embodiments, the second filter 408 includes two series inductors 420, 422 and a capacitor 424 to ground between the two inductors 420, 422. The matching circuit 410 is represented by an example filter (capacitors 426, 428, inductor 430) and is not meant to be limiting.

Figure 5:
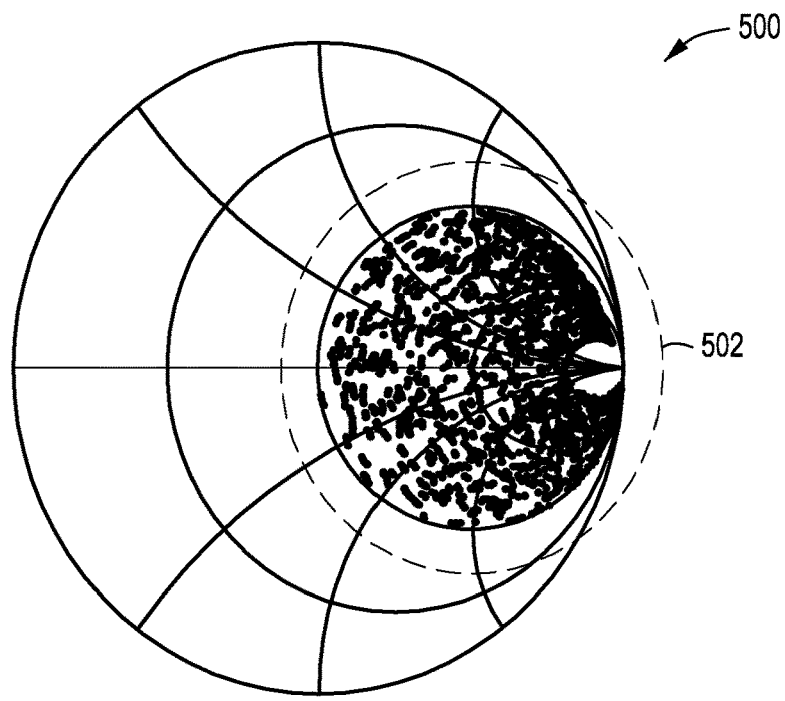
FIG. 5 is a Smith chart illustrating a wide range of impedance tuning coverage provided by a matching network in accordance with some embodiments of the present principles.
Figure 6:
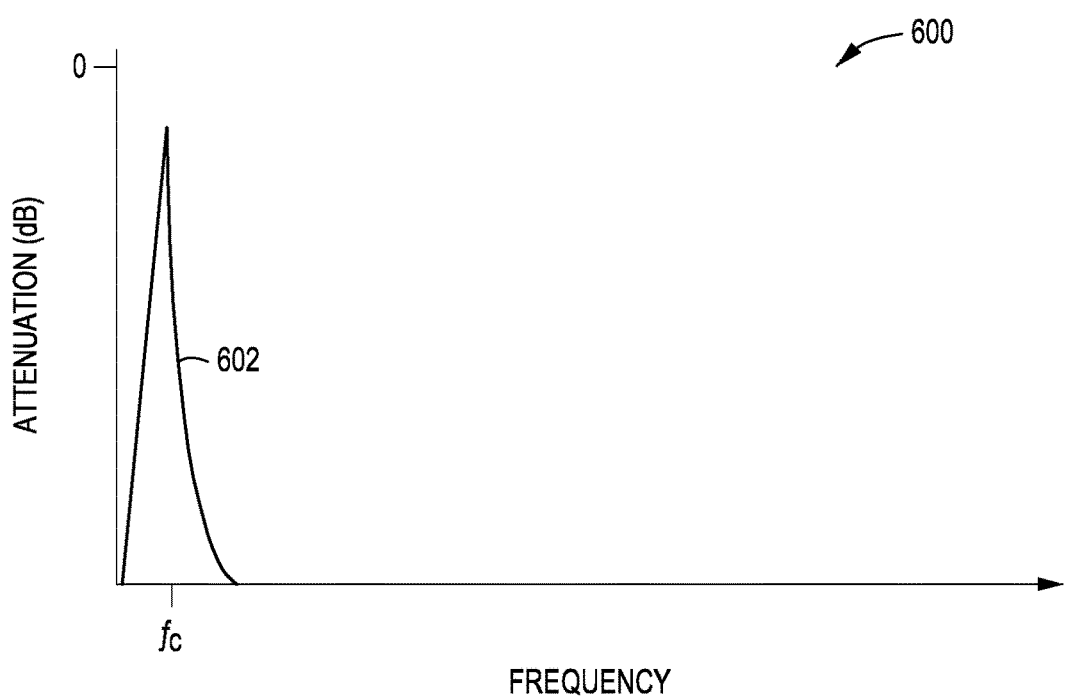
FIG. 6 is a graph illustrating attenuation of reverse RF power at various frequencies above 400 kHz in accordance with some embodiments of the present principles.
Figure 7:
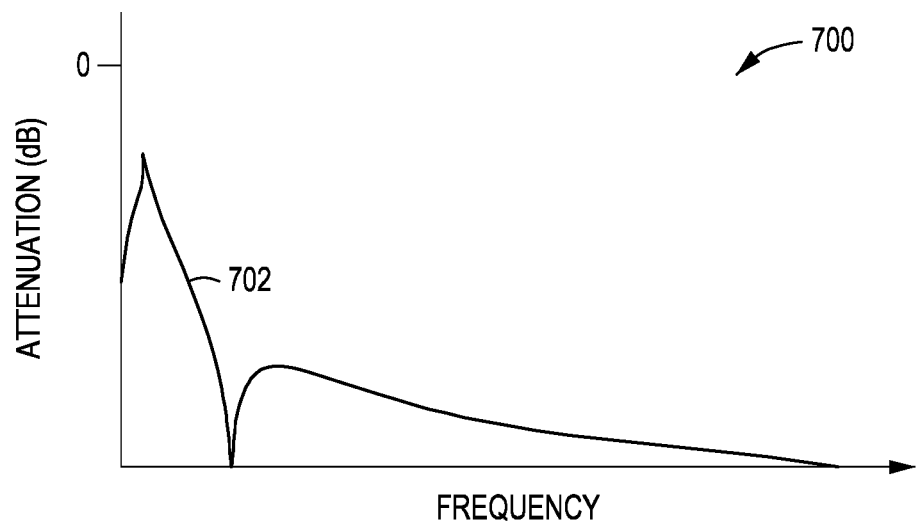
FIG. 7 is a graph illustrating improved safety due to attenuation of reverse RF power from plasma in accordance with some embodiments of the present principles.

FIG. 5 is a Smith chart 500 illustrating a wide range of impedance tuning coverage provided by a matching network in accordance with some embodiments. By using a first filter such as a $2^{nd}$ order wide bandpass LC filter on the output of the matching circuit (see first filter 412 of FIG. 4) and a second filter on the input of the matching circuit such as a $3^{rd}$ order low pass filter (see second filter 408 of FIG. 4), a matching network provides a wide impedance coverage 502 as illustrated in the Smith chart 500 in FIG. 5. The wide impedance coverage 502 is substantially larger than with a traditional matching network. The wide impedance coverage 502 allows the wide Z matching network to compensate for a wide range of impedances encountered during plasma processing for improved tuning and improved stability of the tuning range. FIG. 6 is a graph 600 illustrating an example attenuation curve 602 for reverse RF power at various frequencies above 400 kHz in accordance with some embodiments. A matching network of the present principles such as the matching network 404 shown in FIG. 4, provides filtration for all interfering frequencies above a cutoff frequency, $f_c$ (usually in the MHz range). The matching network 404, with the first filter 412 and the second filter 408, provides a combined $5^{th}$ order filter with attenuation of the interfering frequencies of 60 dB to 100 dB per decade. FIG. 7 is a graph illustrating improved safety due to attenuation of reverse RF power from plasma in accordance with some embodiments. The graph 700 shows an example attenuation curve 702 that may be provided by the matching network 404 of FIG. 4 in some embodiments. In the example, the primary attenuation is more than 33 dB for the matching network 404. In some embodiments, by using a cutoff filter split with a $2^{nd}$ order filter (first filter 412) on the output of the matching circuit 410 and a $3^{rd}$ order filter (second filter 408) on the input of the matching network 404, a substantial preliminary filtering by the first filter 412 of external signals is provided, increasing safety and reliability of the process chamber by preventing the circulation of plasma generated reverse RF power back into a matching network and reduces the risk of arcing of a main inductor of a matching network.

In traditional fixed impedance matching networks, rejection filters are employed for two rejection frequencies that require a second order filter for each rejection frequency (4 poles total) with only 40 dB per decade at the two rejection frequencies. The matching network 404 provides filtration for all interfering frequencies beyond the cutoff frequency $f_c$. By using a cutoff filter instead of parallel rejection filters, as found in the traditional fixed impedance matching networks, the matching network 404 is less sensitive to part parameter changes due to degradation caused by time or temperature variation, does not require tuning of the filters during assembly, and provides wide band filtration that covers a substantially wider impedance range over traditional designs.

Figure 9:
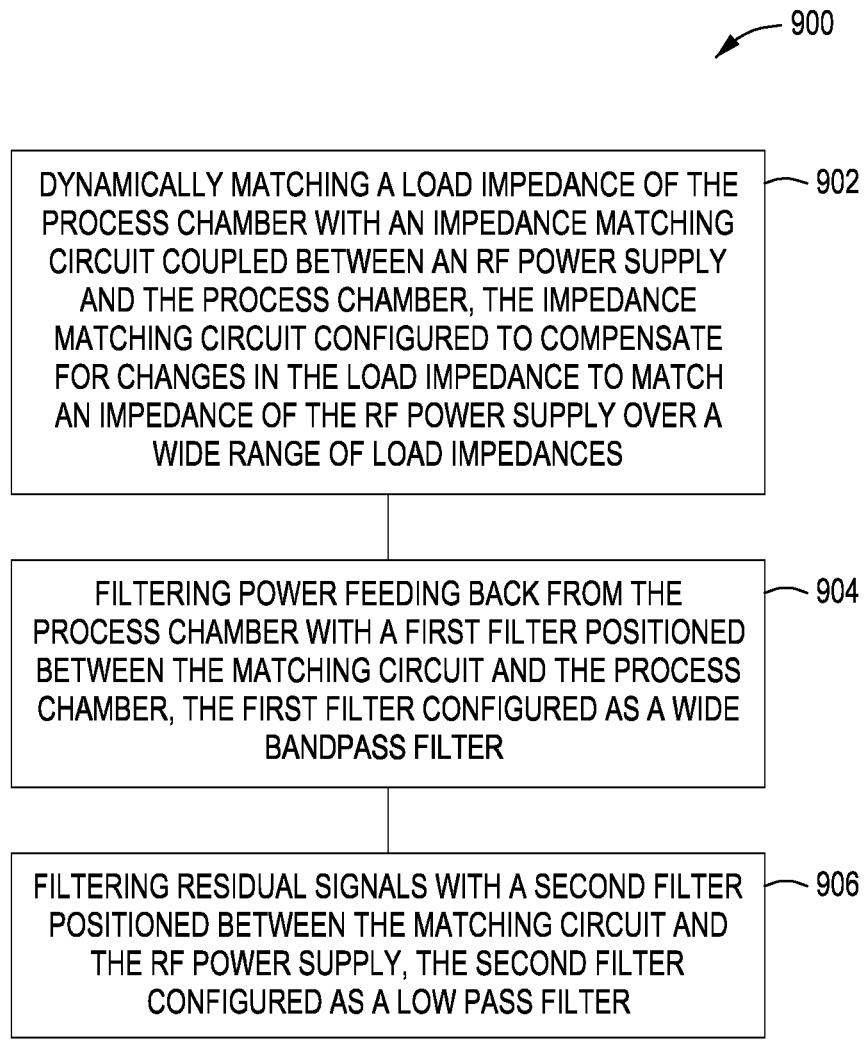
FIG. 9 is a method of matching impedances between an RF power source and a process chamber in accordance with some embodiments of the present principles.

FIG. 9 is a method 900 of matching impedances between an RF power source and a process chamber in accordance with some embodiments. In block 902, a load impedance of the process chamber is dynamically matched with an impedance matching circuit coupled between an RF power source and the process chamber. The impedance matching circuit is configured to dynamically compensate for changes in the load impedance to match an impedance of the RF power source over a wide range of load impedances. In block 904, power feeding back from the process chamber is filtered with a first filter positioned between the matching circuit and the process chamber. The first filter is configured as a wide bandpass filter. In some embodiments, the first filter is a wide bandpass LC $2^{nd}$ order filter that allows for a wide impedance coverage area. In block 906, residual reverse signals from plasma are filtered with a second filter positioned between the matching circuit and the RF power source. The second filter is configured as a low pass filter. In some embodiments, the second filter is at least a $1^{st}$ order filter. In some embodiments, the filter is at least a $3^{rd}$ order filter.

As used herein, a low pass filter is a filter that passes signals with a frequency lower than a selected low pass cutoff frequency, $f_{cutoff}$, and attenuates signals with frequencies higher than the cutoff frequency. The exact frequency response of the low pass filter is dependent upon the filter design and parameters. A wide bandpass filter has a low quality factor, Q, usually less than 10, where Q is $f_{center}/$bandwidth, where $f_{center}$ is the center frequency. The exact frequency response of the wide bandpass filter is dependent upon the filter design and parameters.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof. One skilled in the art will understand that the wide Z matching networks are not limited to the exact configurations and components illustrated above. Various modifications, changes, and variations may be made in arrangement, operation, and details of the methods and apparatus described above.

The invention claimed is:

1. A method for matching an impedance of a process chamber, comprising:
   dynamically matching a load impedance of the process chamber with an impedance matching circuit coupled between a radio frequency (RF) power source and the process chamber, the impedance matching circuit configured to compensate for changes in the load impedance to match an impedance of the RF power source over a wide range of load impedances;
   filtering power feeding back from the process chamber with a first filter positioned between the impedance matching circuit and the process chamber, the first filter configured as a wide bandpass filter; and
   filtering residual signals with a second filter positioned between the impedance matching circuit and the RF power source, the second filter configured as a low pass filter.

2. The method of claim 1, wherein the first filter is a second order filter.

3. The method of claim 1, wherein the second filter is at least a first order filter.

4. The method of claim 1, wherein the second filter is at least a third order filter.

5. The method of claim 1, further comprising:
   configuring parameters of the first filter to have a time constant such that the first filter operates at a frequency at least two times higher than a working frequency of the RF power source.

6. The method of claim 1, further comprising:
   configuring the first filter and the second filter to provide a combined fifth order filter.

7. The method of claim 6, wherein the combined fifth order filter has an attenuation of approximately 60 dB per decade to approximately 100 dB per decade of filtered frequencies.

8. The method of claim 1, further comprising:
   configuring the first filter to provide filtration of frequencies above a cutoff frequency.

9. An apparatus for matching an impedance of a process chamber, comprising:
   an impedance matching circuit configured to compensate for an impedance loading of the process chamber to allow the impedance loading to match an impedance of a radio frequency (RF) power source connected to the process chamber;
   a first filter coupled between the impedance matching circuit and the process chamber, the first filter configured as a wide bandpass filter and configured to protect the RF power source from reverse power from the process chamber; and
   a second filter coupled between the impedance matching circuit and the RF power source, the second filter configured as a low pass filter to reduce residual signals from reaching the RF power source.

10. The apparatus of claim 9, wherein the first filter is a second order filter.

11. The apparatus of claim 9, wherein the second filter is at least a first order filter.

12. The apparatus of claim 9, wherein the second filter is at least a third order filter.

13. The apparatus of claim 9, wherein the first filter is configured to have a time constant such that the first filter operates at a frequency at least two times higher than a working frequency of the RF power source.

14. The apparatus of claim 9, wherein the first filter and the second filter are configured to provide a combined fifth order filter with an attenuation of approximately 60 dB per decade to approximately 100 dB per decade of filtered frequencies.

15. The apparatus of claim 9, wherein the first filter is configured to provide filtration of frequencies above a cutoff frequency.

16. An apparatus for providing power to a process chamber, comprising:
   a radio frequency (RF) power source configured to generate RF source energy to form a plasma in the process chamber; and
   an impedance matching network configured with:
      an impedance matching circuit configured to compensate for an impedance loading of the process chamber to allow the impedance loading to match an impedance of the RF power source connected to the process chamber;
      a first filter coupled between the impedance matching circuit and the process chamber, the first filter configured as a wide bandpass filter and configured to protect the RF power source from reverse power from the process chamber; and
      a second filter coupled between the impedance matching circuit and the RF power source, the second filter configured as a low pass filter to reduce residual signals from reaching the RF power source.

17. The apparatus of claim 16, wherein the first filter is a second order filter.

18. The apparatus of claim 16, wherein the second filter is at least a first order filter.

19. The apparatus of claim 16, wherein the second filter is at least a third order filter.

20. The apparatus of claim 16, wherein the first filter is configured to have a time constant such that the first filter operates at a frequency at least two times higher than a working frequency of the RF power source.

* * * * *